(12) United States Patent
Sakamoto et al.

(10) Patent No.: US 7,048,973 B2
(45) Date of Patent: May 23, 2006

(54) METAL FILM VAPOR PHASE DEPOSITION METHOD AND VAPOR PHASE DEPOSITION APPARATUS

(75) Inventors: Hitoshi Sakamoto, Kanagawa-ken (JP); Naoki Yahata, Hyogo-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 116 days.

(21) Appl. No.: 10/183,512

(22) Filed: Jun. 28, 2002

(65) Prior Publication Data

US 2003/0031791 A1 Feb. 13, 2003

(30) Foreign Application Priority Data

Aug. 8, 2001 (JP) .............................. 2001-241168
Feb. 1, 2002 (JP) .............................. 2002-025975

(51) Int. Cl.
*C23C 16/14* (2006.01)
*C23C 16/448* (2006.01)
*C23C 16/50* (2006.01)

(52) U.S. Cl. .................... 427/576; 427/564; 427/569; 427/573; 427/250; 427/253; 438/687

(58) Field of Classification Search ................ 427/562, 427/564, 569, 573, 576, 250, 253, 255.23, 427/255.28; 438/680, 687
See application file for complete search history.

(56) References Cited

U.S. PATENT DOCUMENTS 5,515,985 A * 5/1996 Ohshita et al. ............... 216/66
5,803,342 A * 9/1998 Kardokus ................. 228/173.2
6,008,140 A * 12/1999 Ye et al. ...................... 438/742
6,440,494 B1 * 8/2002 Arena-Foster .............. 427/250
6,599,572 B1 * 7/2003 Saanila et al. ........ 427/249.18

FOREIGN PATENT DOCUMENTS

| EP | 0322466 A1 | | 7/1989 |
|---|---|---|---|
| EP | 0482265 A1 | | 4/1992 |
| EP | 0573348 A1 | | 12/1993 |
| EP | 1199378 A1 | | 4/2002 |
| JP | 63-223174 A | * | 9/1988 |
| JP | 1-172572 A | | 7/1989 |
| JP | 3-20484 A | | 1/1991 |
| JP | 3-126870 A | | 5/1991 |

(Continued)

OTHER PUBLICATIONS

Bourhila, N. et al., "Copper LPCVD for Advanced Technology," MicroElectronic Engineering, 1997, pp. 25-30, vol. 33, No. 1, Elsevier Science B.V., Amsterdam, Netherlands.

*Primary Examiner*—Timothy Meeks
*Assistant Examiner*—Wesley D. Markham
(74) *Attorney, Agent, or Firm*—Birch, Stewart, Kolasch & Birch, LLP

(57) ABSTRACT

A copper film vapor phase deposition method includes the steps of exposing high-purity copper to a plasma of a gas containing chlorine gas to etch the high-purity copper, thereby generating active $Cu_xCl_y$, wherein x is 1 to 3, y is 1 to 3, gas, and forming a copper film by transporting the $Cu_xCl_y$ gas onto the surface of a substrate to be processed. By using inexpensive high-purity copper and inexpensive chlorine, hydrogen chloride, or chlorine and hydrogen as source gases, a copper film containing no residual impurity such as carbon and having high film quality can be formed with high reproducibility.

6 Claims, 1 Drawing Sheet

FOREIGN PATENT DOCUMENTS

| | | |
|---|---|---|
| JP | 4-72066 A | 3/1992 |
| JP | 4-74866 A | 3/1992 |
| JP | 9-53177 A | 2/1997 |
| JP | 09-298184 A * | 11/1997 |
| JP | 2001-295046 A | 10/2001 |
| JP | 2001-335959 A * | 12/2001 |

* cited by examiner

METAL FILM VAPOR PHASE DEPOSITION METHOD AND VAPOR PHASE DEPOSITION APPARATUS

CROSS-REFERENCE TO RELATED APPLICATIONS

This application is based upon and claims the benefit of priority from the prior Japanese Patent Applications No. 2001-241168, filed Aug. 8, 2001; and No. 2002-025975, filed Feb. 1, 2002, the entire contents of both of which are incorporated herein by reference.

BACKGROUND OF THE INVENTION

1. Field of the Invention

The present invention relates to a copper film vapor phase deposition method and vapor phase deposition apparatus applied to, e.g., the formation of a wiring material film of a semiconductor device.

2. Description of the Related Art

For example, a thin copper (Cu) film used as a wiring material and the like is formed by physical film formation methods such as vacuum deposition, ion plating, and sputtering, and by chemical vapor deposition (CVD). In particular, CVD is generally extensively used because the method has superior surface covering properties.

A conventionally known copper film formation method using CVD uses a liquid organic copper complex such as copper.hexafluoroacetylacetonate.trimethylvinylsilane as a material. Also, Jpn. Pat. Appln. KOKAI Publication Nos. 4-72066, 4-74866, and 9-53177 disclose methods using organic metal complexes not containing fluorine as materials. These materials are sublimated, transported, and excited by heat, light, or plasma to form a copper film on the surface of a substrate to be processed.

Unfortunately, the above-mentioned conventional copper film formation methods have the following problems.

(1) Since material compounds are very expensive, the cost of the copper film formed increases.

(2) Sublimation is very difficult to control, and this makes it difficult to form thin uniform copper films with high reproducibility.

(3) If an organic compound contains carbon, this carbon mixes in a copper film to adversely affect the electrical characteristics and the like.

SUMMARY OF THE INVENTION

It is an object of the present invention to provide a copper film vapor phase deposition method capable of forming, with high reproducibility, a copper film containing no residual impurity such as carbon and having high film quality, by using inexpensive high-purity copper and inexpensive chlorine, hydrogen chloride, or chlorine and hydrogen as source gases.

It is another object of the present invention to provide a copper film vapor phase deposition apparatus capable of forming a copper film having the aforementioned characteristics.

A copper film vapor phase deposition method according to the present invention comprises the steps of exposing high-purity copper to a plasma of a gas containing chlorine gas to etch the high-purity copper, thereby generating active $Cu_xCl_y$, wherein x is 1 to 3, y is 1 to 3, gas, and forming a copper film by transporting the $Cu_xCl_y$ gas onto the surface of a substrate to be processed.

Another copper film vapor phase deposition method according to the present invention comprises the steps of exposing high-purity copper to a plasma of a gas containing hydrogen chloride gas to etch the high-purity copper, thereby generating active $Cu_xCl_y$, wherein x is 1 to 3, y is 1 to 3, gas, and forming a copper film by transporting the $Cu_xCl_y$ gas onto the surface of a substrate to be processed.

Still another copper film vapor phase deposition method according to the present invention comprises the steps of exposing high-purity copper to a plasma of chlorine gas and hydrogen to etch the high-purity copper, thereby generating a gas mixture containing active $Cu_xCl_y$, wherein x is 1 to 3, y is 1 to 3, gas and hydrogen, and forming a copper film by transporting the gas mixture onto the surface of a substrate to be processed.

In each copper film vapor phase deposition method according to the present invention, the high-purity copper is preferably heated to 200 to 400° C., and the substrate is preferably heated to 100 to 200° C.

A copper film vapor phase deposition apparatus according to the present invention comprises a reactor vessel in which a substrate to be processed is placed, high-purity copper set in the reactor vessel to oppose the substrate, a gas supply pipe inserted into the reactor vessel to supply a gas containing chlorine gas or hydrogen chloride gas to the vicinity of the high-purity copper, plasma generating means for generating a plasma of chlorine or hydrogen chloride in the vicinity of the high-purity copper in the reactor vessel, and exhausting means for exhausting a gas in the reactor vessel.

Another copper film vapor phase deposition apparatus according to the present invention comprises a reactor vessel in which a substrate to be processed is placed, high-purity copper set in the reactor vessel to oppose the substrate, a first gas supply pipe inserted into the reactor vessel to supply a gas containing chlorine to the vicinity of the high-purity copper, a second gas supply pipe inserted into the reactor vessel to supply hydrogen to the vicinity of the high-purity copper, plasma generating means for generating a plasma of chlorine and hydrogen in the vicinity of the high-purity copper in the reactor vessel, and exhausting means for exhausting a gas in the reactor vessel.

Each copper film vapor phase deposition apparatus according to the present invention preferably further comprises first temperature control means for controlling the temperature of the high-purity copper.

Each copper film vapor phase deposition apparatus according to the present invention preferably further comprises second temperature control means for controlling the temperature of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention and, together with the generation description given above and the detailed description of the preferred embodiments given below, serve to explain the principles of the invention.

DETAILED DESCRIPTION OF THE INVENTION

The present invention will be described in detail below.

(First Embodiment)

Figure 1:
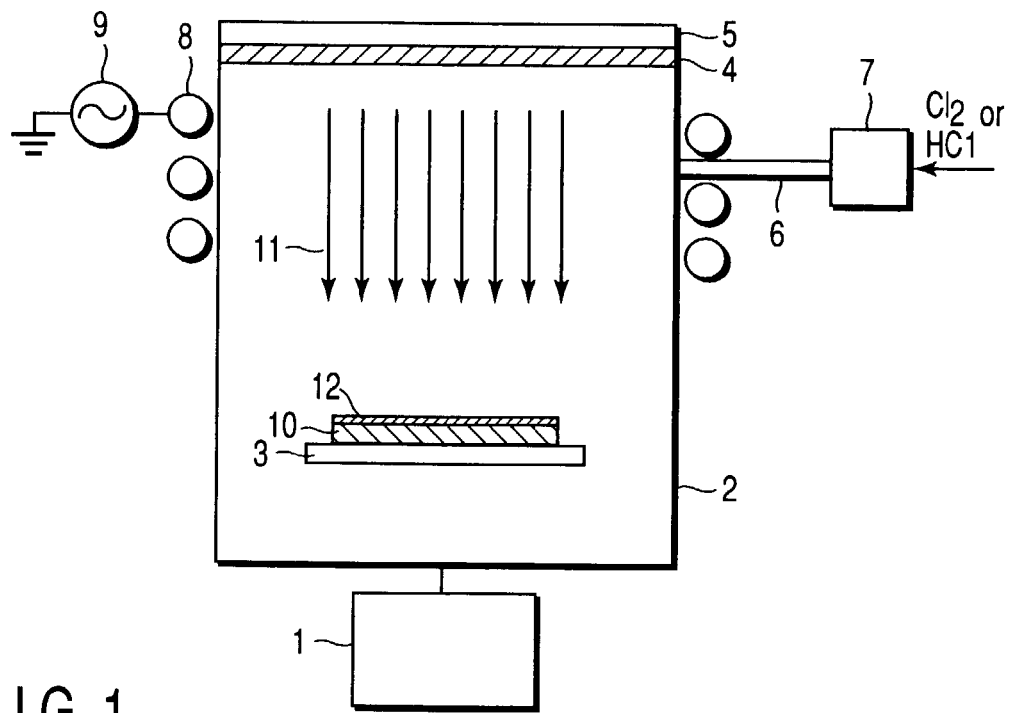
FIG. 1 is a schematic view showing an embodiment of a copper film vapor phase deposition apparatus according to the present invention.

FIG. 1 is a schematic view showing a copper film vapor phase deposition apparatus according to the first embodiment.

In a box-shaped reactor vessel 2 having a bottom portion to which an exhaust member 1 such as a vacuum pump is connected, a second temperature control means e.g., a plate-like heating member 3 on which a substrate to be processed is placed is set. High-purity copper, e.g., high-purity copper plate 4 is set in the upper portion of the reactor vessel 2 so as to oppose the heating member 3. High-purity copper herein mentioned means that the purity of copper is 99.9% or more.

Note that the shape of this high-purity copper need not be a plate but can be, e.g., a block.

A first temperature control means, e.g., a heating/cooling member 5 is placed on the surface of the high-purity copper plate 4 away from the surface opposite to the heating member 3.

A gas supply pipe 6 for supplying a gas containing chlorine gas (or a gas containing hydrogen chloride gas) is connected to an upper side wall of the reactor vessel 2. A flow rate controller 7 is inserted into that portion of the gas supply pipe 6, which is positioned outside the reactor vessel 2.

An RF coil 8 is wound around the upper side walls of the reactor vessel 2. An RF power supply 9 is connected to the RF coil 8 and applies an RF power of 13.56 MHz to this RF coil 8. This plasma generating means need not be an inductive coupling type plasma generator but can be a capacitive coupling type plasma generator.

Referring to FIG. 1, the high-purity copper plate 4 is set in the upper portion of the reactor vessel 2, and the heating member 3 on which a substrate 10 is to be placed and the exhaust member 1 are set in the lower portion of the reactor vessel 2. However, this vertical positional relationship can also be reversed.

A copper film formation method using the copper film vapor phase deposition apparatus shown in FIG. 1 will be explained below.

First, the substrate 10 is placed on the heating member 3 in the reactor vessel 2. The exhaust member 1 is operated to exhaust a gas (air) in the reactor vessel 2 to set a predetermined vacuum degree.

Subsequently, a gas containing chlorine ($Cl_2$) is supplied into the reactor vessel 2 through the gas supply pipe 6. The flow rate of this chlorine-containing gas is controlled by the flow rate controller 7 inserted into the gas supply pipe 6. The temperature of the high-purity copper plate 4 placed in the upper portion of the reactor vessel 2 is controlled by the heating/cooling member 5. After the temperature of this high-purity copper plate 4 is thus controlled, the RF power supply 9 applies an RF power of 13.56 MHz to the RF coil 8, thereby generating chlorine plasma below and near the high-purity copper plate 4 in the reactor vessel 2. If the temperature of the high-purity copper plate 4 excessively rises along with the generation of this chlorine plasma, the heating/cooling member 5 controls the high-purity copper plate 4 to a target temperature.

By thus generating the chlorine plasma in the reactor vessel 2, the high-purity copper plate 4 is etched by the excited chlorine and reacted to generate $Cu_xCl_y$ (x=1 to 3, y=1 to 3) gas. This $Cu_xCl_y$ flux 11 is transported to the substrate 10 heated by the heating member 3 and precipitates a copper film 12 on the surface of the substrate 10. Note that x and y of the $Cu_xCl_y$ gas change in accordance with the temperature. For example, this reaction is represented by

$$2Cu + Cl_2 \rightarrow 2CuCl\uparrow \rightarrow 2Cu\downarrow + Cl_2\uparrow$$

Gases and etching products which do not participate in the reaction are exhausted by the exhaust member 1.

For example, the copper film has a thickness of 1 nm to 1 μm.

As the gas containing chlorine ($Cl_2$), it is possible to use, e.g., chlorine gas or a dilute gas which is formed by diluting chlorine gas with an inert gas such as helium or argon and which has a chlorine concentration of 50% or less.

Heating of the substrate 10 by the heating member 3 is preferably done at a temperature lower than the set temperature of the high-purity copper (e.g., high-purity copper plate) in order to obtain a practical copper film formation rate, thereby promoting adsorption of the $Cu_xCl_y$ gas to the substrate surface. However, if this temperature is too low, a chloride may form in the copper film. Therefore, if the temperature of the high-purity copper is set at 200 to 400° C., the temperature of the substrate is preferably set at, e.g., 100 to 200° C.

By adjusting the temperature of the high-purity copper plate 4 within the range of 0 to 600° C. by the heating/cooling member 5, it is possible to control the surface etching rate and etching form in the chlorine plasma atmosphere. The lower-limit temperature is one at which chlorine gas does not cohere, and the upper-limit temperature is one at which high-purity copper does not dissolve. That is, when the temperature is raised within the above temperature range, it is possible to increase the etching rate ($Cu_xCl_y$ generation amount) and increase the copper film formation speed. However, when the film quality of copper is taken into consideration, the temperature is favorably controlled within the range of 200 to 400° C. in order to prevent an abrupt etching reaction.

The pressure of the chlorine gas in the reactor vessel 2 is preferably controlled within the range of 0.1 to 10 Torr, in order to etch the high-purity copper plate at a practical rate in a vacuum atmosphere.

In the first embodiment as described above, a gas containing inexpensive chlorine is supplied through the gas supply pipe 6 into the reactor vessel 2 in which the inexpensive high-purity copper (e.g., high-purity copper plate) 4 is placed. The RF power supply 9 and the RF coil 8 generate chlorine plasma below and near the high-purity copper plate 4 in the reactor vessel 2. In this manner, the high-purity copper plate 4 is etched by the excited chlorine and reacted to generate $Cu_xCl_y$ gas. This $Cu_xCl_y$ flux 11 is transported to the substrate 10 to form the copper film 12 on the substrate 10.

Also, in this first embodiment, it is possible to independently adjust the temperature of high-purity copper, the pressure and flow rate of chlorine gas, and the temperature of a substrate to be processed. This can increase the degree of freedom of control parameters compared to film formation using the conventional sublimation method. As a consequence, a copper film containing no residual impurity such as carbon and having high film quality can be formed on a substrate with high reproducibility.

(Second Embodiment)

A copper film formation method according to the second embodiment will be explained below by using the copper film vapor phase deposition apparatus shown in FIG. 1 described above.

First, a substrate 10 to be processed is placed on a heating member 3 in a reactor vessel 2. An exhaust member 1 is operated to exhaust a gas (air) in the reactor vessel 2 to set a predetermined vacuum degree.

Subsequently, a gas containing hydrogen chloride (HCl) is supplied into the reactor vessel 2 through a gas supply pipe 6. The flow rate of this hydrogen chloride-containing gas is controlled by a flow rate controller 7 inserted into the gas supply pipe 6. The temperature of high-purity copper (e.g., high-purity copper plate) 4 placed in the upper portion of the reactor vessel 2 is controlled by a heating/cooling member 5. After the temperature of this high-purity copper plate 4 is thus controlled, an RF power supply 9 applies an RF power of 13.56 MHz to an RF coil 8, thereby generating hydrogen chloride plasma below and near the high-purity copper plate 4 in the reactor vessel 2. If the temperature of the high-purity copper plate 4 excessively rises along with the generation of this hydrogen chloride plasma, the heating/cooling member 5 controls the high-purity copper plate 4 to a target temperature.

By thus generating the hydrogen chloride plasma in the reactor vessel 2, the high-purity copper plate 4 is etched by the excited hydrogen chloride and reacted to generate $Cu_xCl_y$ (x=1 to 3, y=1 to 3) gas. This $Cu_xCl_y$ flux 11 is transported to the substrate 10 heated by the heating member 3 and precipitates a copper film 12 on the surface of the substrate 10. Note that x and y of the $Cu_xCl_y$ gas change in accordance with the temperature. For example, this reaction is represented by

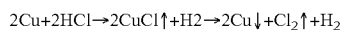

Gases and etching products which do not participate in the reaction are exhausted by the exhaust member 1.

For example, the copper film has a thickness of 1 nm to 1 μm.

As the gas containing hydrogen chloride (HCl), it is possible to use, e.g., hydrogen chloride gas or a dilute gas which is formed by diluting hydrogen chloride gas with an inert gas such as helium or argon and which has a chlorine concentration of 50% or less.

Heating of the substrate 10 by the heating member 3 is preferably done at a temperature lower than the set temperature of the high-purity copper (e.g., high-purity copper plate) in order to obtain a practical copper film formation rate, thereby promoting adsorption of the $Cu_xCl_y$ gas to the substrate surface. However, if this temperature is too low, a chloride may form in the copper film. Therefore, if the temperature of the high-purity copper is set at 200 to 400° C., the temperature of the substrate is preferably set at, e.g., 100 to 200° C.

By adjusting the temperature of the high-purity copper plate 4 within the range of 0 to 600° C. by the heating/cooling member 5, it is possible to control the surface etching rate and etching form in the hydrogen chloride plasma atmosphere. The lower-limit temperature is one at which chlorine gas does not cohere, and the upper-limit temperature is one at which high-purity copper does not dissolve. That is, when the temperature is raised within the above temperature range, it is possible to increase the etching rate ($Cu_xCl_y$ generation amount) and increase the copper film formation speed. However, when the film quality of copper is taken into consideration, the temperature is favorably controlled within the range of 200 to 400° C. in order to prevent an abrupt increase of the etching reaction.

The pressure of the hydrogen chloride gas in the reactor vessel 2 is preferably controlled within the range of 0.1 to 10 Torr, in order to etch the high-purity copper plate at a practical rate in a vacuum atmosphere.

In the second embodiment as described above, a gas containing inexpensive hydrogen chloride is supplied through the gas supply pipe 6 into the reactor vessel 2 in which the inexpensive high-purity copper (e.g., high-purity copper plate) 4 is placed. The RF power supply 9 and the RF coil 8 generate hydrogen chloride plasma below and near the high-purity copper plate 4 in the reactor vessel 2. In this manner, the high-purity copper plate 4 is etched by the excited hydrogen chloride and reacted to generate $Cu_xCl_y$ gas. This $Cu_xCl_y$ flux 11 is transported to the substrate 10 to form the copper film 12 on the substrate 10.

Also, in this second embodiment, it is possible to independently adjust the temperature of high-purity copper, the pressure and flow rate of hydrogen chloride gas, and the temperature of a substrate to be processed. This can increase the degree of freedom of control parameters compared to film formation using the conventional sublimation method. As a consequence, a copper film containing no impurity such as carbon and having high film quality can be formed on a substrate with high reproducibility.

(Third Embodiment)

Figure 2:
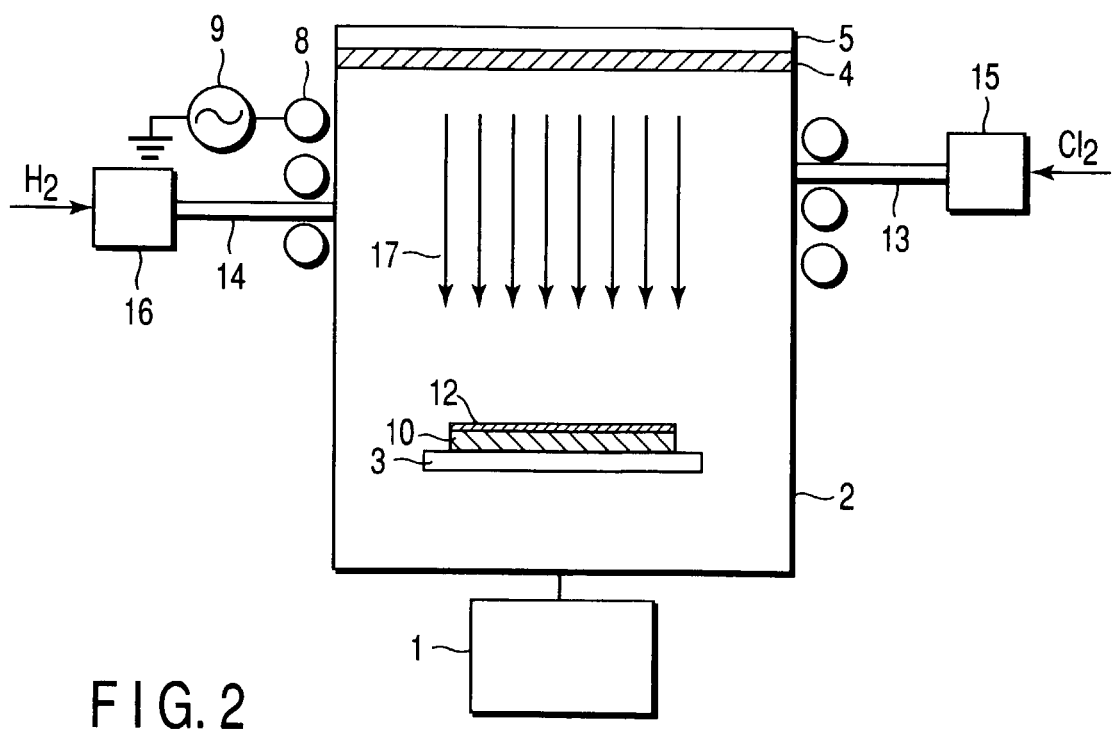
FIG. 2 is a schematic view showing another embodiment of the copper film vapor phase deposition apparatus according to the present invention.

FIG. 2 is a schematic view showing a copper film vapor phase deposition apparatus according to the third embodiment. The same reference numerals as in FIG. 1 denote the same parts in FIG. 2, and a detailed description thereof will be omitted.

This vapor phase deposition apparatus includes a first gas supply pipe 13 connected to an upper side wall of a reactor vessel 2 to supply a gas containing chlorine, and a second gas supply pipe 14 connected to that upper side wall of the reactor vessel 2, which is opposite to the first gas supply pipe 13, to supply hydrogen. Flow rate controllers 15 and 16 are inserted into these first and second gas supply pipes 13 and 14, respectively.

Referring to FIG. 2, high-purity copper (e.g., high-purity copper plate) 4 is set in the upper portion of the reactor vessel 2, and a heating member 3 on which a substrate 10 to be processed is placed and an exhaust member 1 are set in the lower portion of the reactor vessel 2. However, this vertical positional relationship can also be reversed.

Note that the shape of the high-purity copper need not be a plate but can be, e.g., a block.

A copper film formation method using the copper film vapor phase deposition apparatus shown in FIG. 2 will be explained below.

First, the substrate 10 is placed on the heating member 3 in the reactor vessel 2. The exhaust member 1 is operated to exhaust a gas (air) in the reactor vessel 2 to set a predetermined vacuum degree.

Subsequently, a gas containing chlorine (Cl$_2$) is supplied into the reactor vessel 2 through the first gas supply pipe 13, and hydrogen is supplied into the reactor vessel 2 through the second gas supply pipe 14. The flow rates of these chlorine-containing gas and hydrogen are controlled by the flow rate controllers 15 and 16 inserted into the gas supply pipes 13 and 14, respectively. The temperature of the high-purity copper plate 4 placed in, e.g., the upper portion of the reactor vessel 2 is controlled by a heating/cooling member 5. After the temperature of this high-purity copper plate 4 is thus controlled, an RF power supply 9 applies an RF power of 13.56 MHz to an RF coil 8, thereby generating a plasma of chlorine+hydrogen below and near the high-purity copper plate 4 in the reactor vessel 2. If the temperature of the high-purity copper plate 4 excessively rises along with the generation of this plasma of chlorine+hydrogen, the heating/cooling member 5 controls the high-purity copper plate 4 to a target temperature.

By thus generating the plasma of chlorine+hydrogen in the reactor vessel 2, the high-purity copper plate 4 is etched by the excited chlorine, and dissociation of hydrogen occurs to generate a flux 17 of Cu$_x$Cl$_y$ (x=1 to 3, y=1 to 3) and H. This flux 17 is transported to the substrate 10 heated by the heating member 3 and precipitates a copper film 12 on the surface of the substrate 10. Note that x and y of the Cu$_x$Cl$_y$ gas change in accordance with the temperature. For example, this reaction is represented by

$$2Cu+Cl_2+H_2 \rightarrow 2CuCl\uparrow +H_2 \rightarrow 2Cu\downarrow +2HCl\uparrow$$

Gases and etching products that do not participate in the reaction are exhausted by the exhaust member 1.

For example, the copper film has a thickness of 1 nm to 1 μm.

As the gas containing chlorine (Cl$_2$), it is possible to use, e.g., chlorine gas or a dilute gas which is formed by diluting chlorine gas with an inert gas such as helium or argon and which has a chlorine concentration of 50% or less.

Heating of the substrate 10 by the heating member 3 is preferably done at a temperature lower than the set temperature of the high-purity copper (e.g., high-purity copper plate) in order to obtain a practical copper film formation rate, thereby promoting adsorption of the Cu$_x$Cl$_y$ gas to the substrate surface. However, if this temperature is too low, a chloride may form in the copper film. Therefore, if the temperature of the high-purity copper is set at 200 to 400° C., the temperature of the substrate is preferably set at, e.g., 100 to 200° C.

By adjusting the temperature of the high-purity copper plate 4 within the range of 0 to 600° C. by the heating/cooling member 5, it is possible to control the surface etching rate and etching form in the chlorine+hydrogen plasma atmosphere. The lower-limit temperature is one at which chlorine gas does not cohere, and the upper-limit temperature is one at which high-purity copper does not dissolve. That is, when the temperature is raised within the above temperature range, it is possible to increase the etching rate (Cu$_x$Cl$_y$ generation amount) and increase the copper film formation speed. However, when the film quality of copper is taken into consideration, the temperature is favorably controlled within the range of 200 to 400° C. in order to prevent an abrupt increase of the etching reaction.

The pressure of the chlorine gas in the reactor vessel 2 is preferably controlled within the range of 0.1 to 10 Torr, in order to etch the high-purity copper plate at a practical rate in a vacuum atmosphere.

The pressure of the hydrogen gas in the reactor vessel 2 is preferably controlled within the range of 1 to 10 Torr, in order to efficiently precipitate (form) a copper film by reduction.

In the third embodiment as described above, a gas containing inexpensive chlorine and hydrogen are supplied through the first and second gas supply pipes 13 and 14 into the reactor vessel 2 in which the inexpensive high-purity copper (e.g., high-purity copper plate) 4 is placed. The RF power supply 9 and the RF coil 8 generate a plasma of chlorine and hydrogen below and near the high-purity copper plate 4 in the reactor vessel 2. Etching of the high-purity copper plate 4 by the excited chlorine and dissociation of hydrogen generate the flux 17 of Cu$_x$Cl$_y$ and H. This flux 17 is transported to the substrate 10 to form the copper film 12 on the substrate 10.

Also, in this third embodiment, it is possible to independently adjust the temperature of high-purity copper, the pressures and flow rates of chlorine gas and hydrogen, and the temperature of a substrate to be processed. This can increase the degree of freedom of control parameters compared to film formation using the conventional sublimation method. As a consequence, a copper film containing no residual impurity such as carbon and having high film quality can be formed on a substrate with high reproducibility.

EXAMPLES

Preferred examples of the present invention will be explained in detail below with reference to FIGS. 1 and 2 described above.

Example 1

As shown in FIG. 1, a substrate 10 to be processed having a diameter of 300 mm was placed on a heating member 3 in a reactor vessel 2 and heated to 200° C. An exhaust member 1 was operated to exhaust a gas (air) in the reactor vessel 2 to set a predetermined vacuum degree.

Subsequently, chlorine (Cl$_2$) was supplied at a flow rate of 100 sccm into the reactor vessel 2 through a gas supply pipe 6 and a flow rate controller 7. The pressure of the chlorine in the reactor vessel 2 was 5 Torr. The temperature of high-purity copper plate 4 set in the upper portion of the reactor vessel 2 was controlled to 300° C. by a heating/cooling member 5. After the temperature of this high-purity copper plate 4 was thus controlled, an RF power of 13.56 MHz was applied from an RF power supply 9 to an RF coil 8, thereby generating chlorine plasma below and near the high-purity copper plate 4 in the reactor vessel 2. Consequently, the high-purity copper plate 4 was etched by the excited chlorine and reacted to form Cu$_x$Cl$_y$ flux 11, thereby precipitating a copper film 12 having a thickness of 500 nm on the surface of the substrate 10. Gases and etching products which did not participate in the reaction were exhausted by the exhaust member 1.

In Example 1 described above, a copper film was uniformly formed on the substrate at a rate of 100 nm/min and a variation of 3% or less. This copper film had characteristics equivalent to the resistivity of bulk copper.

Example 2

As shown in FIG. 1, a substrate 10 to be processed having a diameter of 300 mm was placed on a heating member 3 in a reactor vessel 2 and heated to 170° C. An exhaust member 1 was operated to exhaust a gas (air) in the reactor vessel 2 to set a predetermined vacuum degree.

Subsequently, hydrogen chloride (HCl) was supplied at a flow rate of 100 sccm into the reactor vessel 2 through a gas supply pipe 6 and a flow rate controller 7. The pressure of the chlorine in the reactor vessel 2 was 5 Torr. The temperature of high-purity copper plate 4 set in the upper portion of the reactor vessel 2 was controlled to 300° C. by a heating/cooling member 5. After the temperature of this high-purity copper plate 4 was thus controlled, an RF power of 13.56 MHz was applied from an RF power supply 9 to an RF coil 8, thereby generating hydrogen chloride plasma below and near the high-purity copper plate 4 in the reactor vessel 2. Consequently, the high-purity copper plate 4 was etched by the excited hydrogen chloride and reacted to form $Cu_xCl_y$ flux 11, thereby precipitating a copper film 12 having a thickness of 500 nm on the surface of the substrate 10. Gases and etching products which did not participate in the reaction were exhausted by the exhaust member 1.

In Example 2 described above, a copper film was uniformly formed on the substrate at a rate of 100 nm/min and a variation of 3% or less. This copper film had characteristics equivalent to the resistivity of bulk copper.

Example 3

As shown in FIG. 2, a substrate 10 to be processed having a diameter of 300 mm was placed on a heating member 3 in a reactor vessel 2 and heated to 150° C. An exhaust member 1 was operated to exhaust a gas (air) in the reactor vessel 2 to set a predetermined vacuum degree.

Subsequently, chlorine gas was supplied at a flow rate of 100 sccm into the reactor vessel 2 through a first gas supply pipe 13 and a flow rate controller 15. Also, hydrogen was supplied at a flow rate of 500 sccm into the reactor vessel 2 through a second gas supply pipe 14 and a flow rate controller 16. The pressures of the chlorine gas and hydrogen in the reactor vessel 2 were 2.5 and 5 Torr, respectively. The temperature of high-purity copper plate 4 set in the upper portion of the reactor vessel 2 was controlled to 300° C. by a heating/cooling member 5. After the temperature of this high-purity copper plate 4 was thus controlled, an RF power of 13.56 MHz was applied from an RF power supply 9 to an RF coil 8, thereby generating a plasma of chlorine and hydrogen below and near the high-purity copper plate 4 in the reactor vessel 2. Consequently, etching of the high-purity copper plate 4 by the excited chlorine and dissociation of hydrogen formed a flux 17 of $Cu_xCl_y$ and H, thereby precipitating a copper film 12 having a thickness of 500 nm on the surface of the substrate 10. Gases and etching products which did not participate in the reaction were exhausted by the exhaust member 1.

In Example 3 described above, a copper film was uniformly formed on the substrate at a rate of 100 nm/min and a variation of 3% or less. This copper film had characteristics equivalent to the resistivity of bulk copper.

As has been explained above, the present invention can provide a copper film vapor phase deposition method which can form, with high reproducibility, a copper film containing no residual impurity such as carbon and having high film quality, by using inexpensive high-purity copper and inexpensive chlorine, hydrogen chloride, or chlorine and hydrogen as source gases, and which is useful in, e.g., the formation of wiring material films of a semiconductor device and a liquid crystal display.

Also, the present invention can provide a copper film vapor phase deposition apparatus capable of forming a copper film having the aforementioned characteristics.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A copper film vapor phase deposition method, comprising:
    heating a substrate to be processed in a reactor vessel at 100 to 200° C.;
    heating a high-purity copper set in the reactor vessel to oppose the substrate at 200 to 400° C.;
    exposing the high-purity copper at a temperature of 200 to 400° C. to a plasma of a gas containing chlorine gas to etch the high-purity copper, thereby generating active $Cu_xCl_y$, wherein x is 1 to 3, y is 1 to 3, gas in the reactor vessel; and
    forming a copper film by transporting the $Cu_xCl_y$ gas onto a surface of a substrate to be processed, the substrate temperature being 100 to 200° C.

2. A method according to claim 1, wherein the high-purity copper has the shape of a plate.

3. A copper film vapor deposition method, comprising:
    heating a substrate to be processed in a reactor vessel at 100 to 200° C.;
    heating a high-purity copper set in the reactor vessel to oppose the substrate at 200 to 400° C.;
    exposing the high-purity copper at a temperature of 200 to 400° C. to a plasma of a gas containing hydrogen chloride gas to etch the high-purity copper, thereby generating active $Cu_xCl_y$, wherein x is 1 to 3, y is 1 to 3, gas in the reactor vessel; and
    forming a copper film by transporting the $Cu_xCl_y$ gas onto a surface of a substrate to be processed, the substrate temperature being 100 to 200° C.

4. A method according to claim 3, wherein the high-purity copper has the shape of a plate.

5. A copper film vapor phase deposition method, comprising:
    heating a substrate to be processed in a reactor vessel at 100 to 200° C.;
    heating a high-purity copper set in the reactor vessel to oppose the substrate at 200 to 400° C.;
    exposing the high-purity copper at a temperature of 200 to 400° C. to a plasma of a gas containing chlorine gas and hydrogen to etch the high-purity copper, thereby generating a gas mixture containing active $Cu_xCl_y$, wherein x is 1 to 3, y is 1 to 3, gas and hydrogen in the reactor vessel; and
    forming a copper film by transporting the gas mixture onto a surface of a substrate to be processed, the substrate temperature being 100 to 200° C.

6. A method according to claim 5, wherein the high-purity copper has the shape of a plate.

* * * * *